United States Patent [19]

Sidhu

[11] 4,132,954
[45] Jan. 2, 1979

[54] NOISE SUPPRESSION CIRCUIT ADAPTED FOR USE WITH BIFILAR WINDINGS

[75] Inventor: Pawitter S. Sidhu, Los Angeles, Calif.

[73] Assignee: Micro Peripherals, Inc., Sepulveda, Calif.

[21] Appl. No.: 827,882

[22] Filed: Aug. 26, 1977

[51] Int. Cl.² .............................................. H03K 5/00
[52] U.S. Cl. ................................... 328/165; 330/69; 330/124 R; 330/149; 330/295
[58] Field of Search ................ 307/232; 328/163, 165, 328/167; 330/69, 86, 149, 124 R, 295

[56] References Cited

U.S. PATENT DOCUMENTS

| 3,036,271 | 5/1962 | Alexander et al. | 328/165 X |
| 3,419,809 | 12/1968 | Lach et al. | 330/69 X |
| 3,571,730 | 3/1971 | Webb | 328/165 X |
| 3,593,162 | 7/1971 | Patmore | 328/165 X |

FOREIGN PATENT DOCUMENTS 2327671 12/1974 Fed. Rep. of Germany ............ 328/165

OTHER PUBLICATIONS

Hollstein, "Read Data Gate Generator," *IBM Technical Disclosure Bulletin*, vol. 12, No. 12, May 1970, pp. 2183-2184.

*Primary Examiner*—James B. Mullins
*Attorney, Agent, or Firm*—Albert M. Herzig; Edward C. Walsh

[57] ABSTRACT

A noise suppression circuit adapted for use with bifilar windings such as normally present in magnetic pick-up heads. The signals from the windings are coupled to a pair of operational amplifiers having a common gain control resistor for filtering out common mode noise. The first stage amplifiers are coupled to a pair of second stage amplifiers biased at the voltage of the bifilar windings and have resistance-capacitance filter circuits. The second stage amplifiers are coupled to a third stage amplifier which transforms the signal to digital form, the remaining noise appearing as spikes in the signal. The output of this amplifier is coupled to a digital noise filter circuit which includes a one-shot multivibrator coupled to a flip-flop arranged to control the digital waveform so as to filter out the spikes, that is, to eliminate the noise in the signal.

8 Claims, 3 Drawing Figures

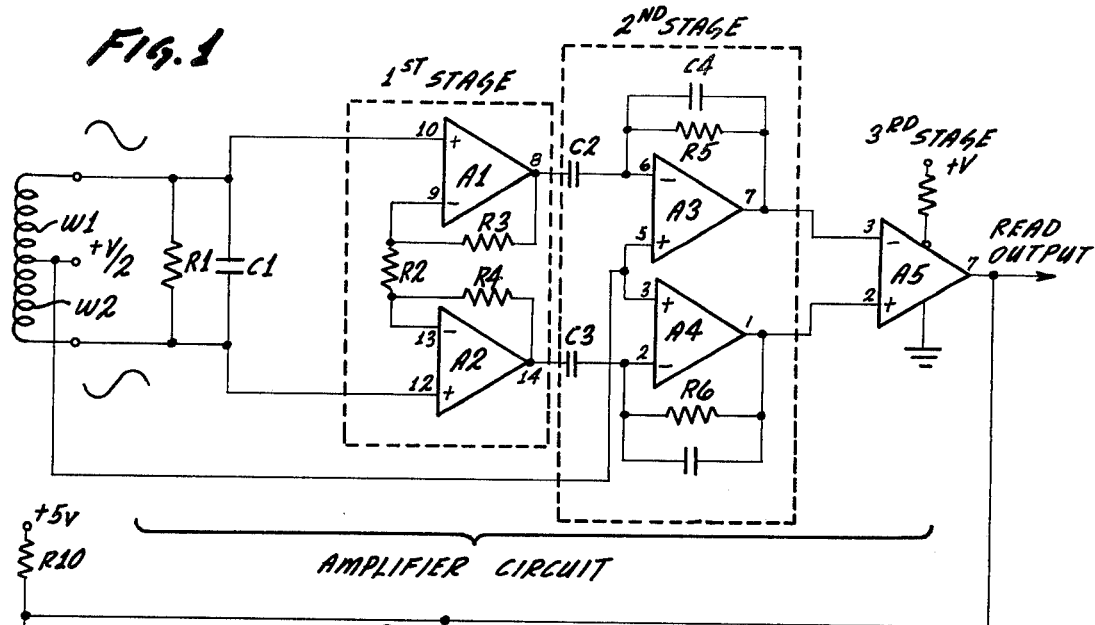
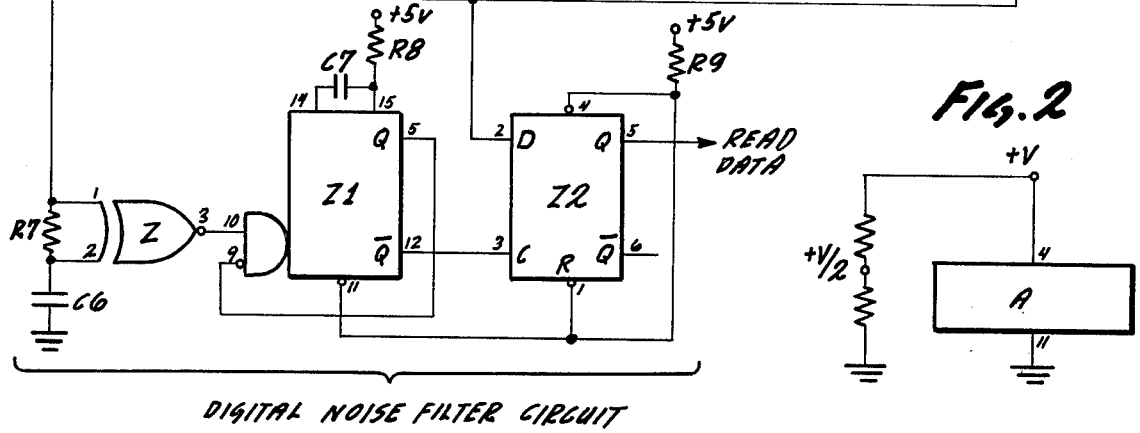
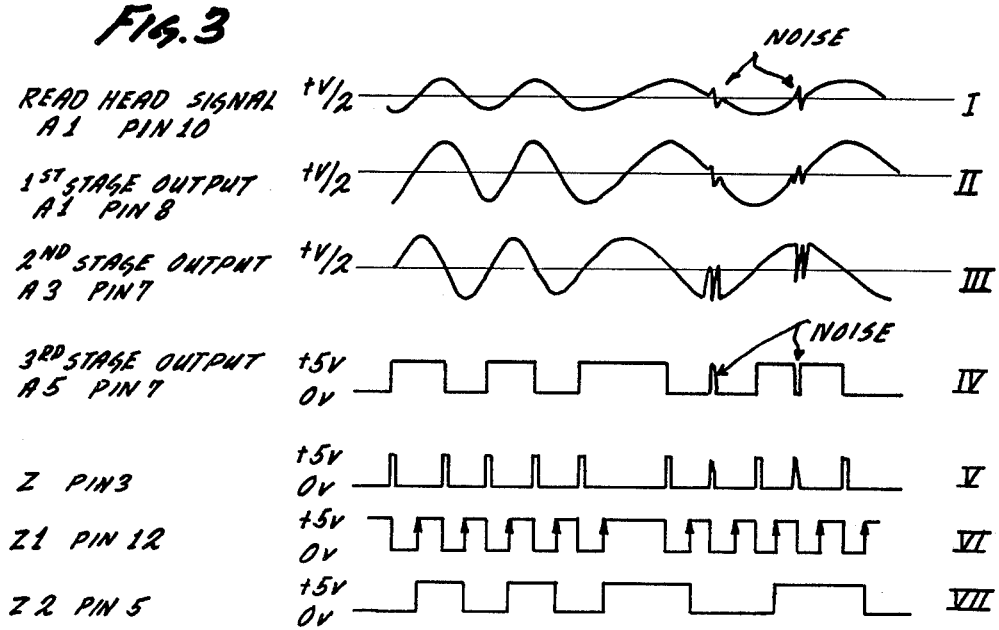

NOISE SUPPRESSION CIRCUIT ADAPTED FOR USE WITH BIFILAR WINDINGS

BACKGROUND OF THE INVENTION

1. Field of the Invention

The field of the invention is that of amplifier circuits embodying means within the circuit for suppressing or filtering out noise. The circuitry is particularly adapted for amplifying and suppressing noise in signals from bifilar windings such as typically appear in a magnetic readout head.

2. Description of the Prior Art

The circuitry utilizes solid state components which individually are commercially known items, as far as known, however, there being no prior knowledge or teaching of the circuitry as a combination or the function it is able to achieve.

SUMMARY OF THE INVENTION

A preferred form is described in detail hereinafter. It is particularly adapted as an amplifier and noise suppression circuit in connection with bifilar windings such as normally appear in a magnetic readout head.

The signals from the windings are coupled to first stage twin operational amplifiers having a common gain control for filtering common mode noise. The first stage amplifiers are coupled to second stage twin operational amplifiers biased at the voltage of the bifilar windings, these amplifiers having filter circuits for further filtering of noise. The second stage amplifiers are coupled to a third stage amplifier which transforms the signal into digital form with the remaining noise appearing as spikes in the signal waveform.

The output of the third stage amplifier is coupled to a digital noise filter circuit which includes an exclusive-OR gate coupled to a multivibrator and flip-flop which together operate on the signal in digital form to isolate or filter out the noise spikes from the digital signal so that the remaining is eliminated.

In the light of the foregoing, the primary object of the invention is to realize an improved noise suppression amplifier circuit particularly adapted for use with signals emanating from bifilar windings.

A further object is to realize a more effective circuit as in the foregoing using first stage and second stage twin amplifiers and third stage amplifier means capable of transforming the low level signal to digital form with the noise in a form which can readily be filtered.

A further object is to realize circuit means as in the previous object including a digital noise filter circuit constructed to filter out the noise which is in the form of spikes.

Further objects and additional advantages of the invention will become apparent from the following detailed description and annexed drawings.

BRIEF DESCRIPTION OF THE DRAWINGS

FIG. 1 is a circuit diagram of a preferred form of the invention;

FIG. 2 is a simplified diagram illustrating a solid state component embodying four of the operational amplifiers of FIG. 1 and showing the power supply for these amplifiers;

FIG. 3 is a group of timing diagrams representing the output waveforms at various stages in the circuit.

DESCRIPTION OF THE PREFERRED EMBODIMENT

The noise suppression circuitry of the invention is well adapted for utilization in connection with the output of a magnetic read head associated with a magnetic disc record which may be of the flexible type. The character A represents a solid state component or chip embodying a plurality of operational amplifiers as will be referred to presently. It is connected to ground and to a voltage source identified as $+V$. The voltage source is connected to ground through a pair of resistors as shown, the mid-point terminal of which is at voltage $V/2$.

The characters W1 and W2 designate the bifilar windings which may be in the magnetic read head.

A typical waveform of the read head signal is shown at I in FIG. 3. The bifilar windings of the read head are coupled into the positive inputs of two first stage operational amplifiers A1 and A2. The resistor R1 and capacitor C1 are connected across the inputs of the amplifiers A1 and A2 to match the characteristic impedance of the head windings W1 and W2 at the read signal frequency. The center or mid-terminal of the bifilar windings is biased at $+V/2$ and the amplifiers are biased between $+V$ and ground as indicated in FIG. 2. The read head windings as stated are biased at $+V/2$ along with the positive input terminals 10 and 12 of the two operational amplifiers A1 and A2. The two parallel connected operational amplifiers A1 and A2 are referenced against each other. The beneficial result is that noise signals either from ground or voltage supply are totally isolated. The gain of both amplifiers is fixed by the single resistor R2 which are related with feedback resistors R3 and R4. The outputs of the two operational amplifiers, terminals 8 and 14, respectively, are connected to their respective inputs through the feedback resistors R3 and R4. A typical output waveform is shown at II in FIG. 3. Resistor R2 is connected across the two negative going inputs of the operational amplifiers, that is, terminals 9 and 13, and accordingly, a single resistor fixes the gain of both the operational amplifiers A1 and A2. The gain of each amplifier is equal to R3/R2 assuming that R3 equals R4.

As previously stated, typically the magnetic head is bifilar wound and accordingly, the signal in the two inputs, terminals 10 and 12, are of opposite polarities. Amplified signals appear on terminals 8 and 14 in FIG. 1. The noise present in the read head signal is not amplified. If there is no current flow through R2, there is no signal to terminals 9 and 13. The noise, that is, the common mode noise, that is, signals of the same polarity and waveform that are identical are filtered out, this function in connection with twin operational amplifiers being known in the art as described, for example, in Vol. MPC30M37, Linear Applications Handbook, published by National Semi-Conductor Corporation, 2900 Semi-Conductor Drive, Santa Clara, California 95051, pages AN 31-10; AN 20-4.

The capacitors C2 and C3 couple the amplified read signal into the inputs of the two additional operational amplifiers A3 and A4 at negative terminals 6 and 2, respectively. The positive inputs of amplifiers A3 and A4, that is, terminals 3 and 5, are biased at $+V/2$. Resistor R5, capacitor C2 and resistor R6 and capacitor C3 determine the gain or amplification of the second stage amplifiers A3 and A4. The capacitors C2 and C3 cause a 90° phase shift in the signals as shown in the waveform diagram III of FIG. 3 with respect to the read head signal and the first stage output.

The output of the A3 amplifier at terminal 7 and of amplifier A4 at terminal 1 are connected to the differential inputs of terminals 3 and 2 of amplifier A5. This amplifier is biased at +V. These opposite polarity signals are subtracted by A5 with the net result that the signals are added and amplified being transformed into digital signals as shown in the timing diagram waveform IV which is the waveform at the third stage output. Whenever two signals of the same polarity and magnitude are presented to a differential input, they are subtracted and cancelled out so that only the difference is amplified.

The objective of the mode or manner described above of connecting the amplifiers to the read head windings is to amplify the low level signals differentially, that is, with respect to each other rather than to a ground or supply. This eliminates any noise from entering into the signal from ground or zero voltage supply. The signal is only referenced to ground or supply at the output of the third stage at which point it is a digital signal of at least 5 volts typically, as compared to a one millivolt signal at the readout head output. Further, the noise, if present at the head read signal, is not amplified by the first stage but stays at the same level due to the way resistor R2 is connected across the two first stage amplifiers A1 and A2. The second stage amplifiers filter out the noise through capacitors C4 and C5 connected across the feedback resistors R5 and R6, respectively. The third stage amplifiers, however, having a differential input, filter the noise signal of the same polarity at terminals 2 and 3. However, noise, by definition is unpredictable in its frequency and polarity content so some parts of the noise which have not been filtered out will be amplified by amplifier A5 and transformed into digital form as shown in waveform IV, FIG. 2. The noise appears as spikes in this waveform.

The Digital Noise Filter Circuit eliminates the noise spikes from the read output signal of amplifier A5 at terminal 7 as explained hereinafter. This signal is fed into an exclusive —OR gate Z which may be of the type identified as SN7486N in the catalog of Texas Instruments, Inc. and then the signal is delayed by the resistance capacitance circuit provided by resistor R7 and capacitor C6 and the delayed signal is then applied to terminal 2 of gate Z. The output of gate Z at terminal 3 is a positive going pulse at any time the level changes at the input. The pulse width is directly proportional to the product of resistor 7 and capacitor C6. The typical waveform is illustrated at V, in FIG. 3. The leading edge of this signal turns on the one-shot multivibrator Z1 which may be of the type identified as SN74123N, the time of which is set to be equal to one-half the time between pulses by resistor R8 and capacitor C7. The read output from the third stage is connected to the D terminal of the flip-flop component Z2 and is clocked in at the trailing edge of the one shot multivibrator Z1 of the output at terminal 12. The level at the D input of flip-flop Z2 controls the output at the Q terminal at the time of the clocking edge in accordance with the known function of the component which may be type SN7474N. The waveform at terminal C is that illustrated at VI, FIG. 2. Component Z1 and component Z2 are each biased to a positive 5 volt source as shown through resistors R8 and R9.

The noise present at terminal 7 of A5 will generate a false pulse at terminal 3 of Z and will falsely turn on the one-shot multivibrator Z1 since the level at terminal 2 of Z2 at the delay time is the same as before and after the noise pulse, the output at terminal 5 of Z2 stays at the same level. Comparing the signals at terminals 5 and 3, the signal at terminal 5 is delayed but without the noise pulses.

The operation of the component Z2 can be further described as follows. The level present at the D input at the time the clock input which is from terminal 12 goes high is sensed and stored inside Z2 and then is presented to the output Q. Flip-flop 22 is sensed only at the time shown as marked by the arrows in the waveform VI of the clock input. Shown in the timing of waveform IV and waveform V, are the noise spikes as large as the signal present. They trigger the one-shot multivibrator but the digital level at D input stays the same before and after the noise. Thus, the flip-flop Z2 output at terminal 5 does not sense or does not store the noise spikes, that is, the Z2 waveform at terminal 5 shown at VII does not have the noise spikes in it. These are filtered out by the time delayed action of Z1 at terminal 12 as seen in waveform VI.

The signal at terminal 2 of Z2 senses the high or low level of the No. IV waveform signal at the time of the arrows shown in waveform VI, that is, when it is positive going. Because of sensing at this time which is not at the same position as the noise spikes, the noise spikes are filtered out.

The noise suppression circuit as described is free of ground and power supply noise and along with the digital noise filter gives this particular amplifier system extremely desirable characteristics ideally needed in any magnetic readout system whether for flexible disc records or otherwise, such as cassettes, cartridges, disc drives and tape drives.

What is claimed is:

1. A noise suppression amplifier circuit means adapted for use with bifilar windings having a mid-terminal comprising in combination, a pair of operational amplifiers having a common gain control resistor coupled to the bifilar windings for filtering common mode noise in signals, a second pair of operational amplifiers coupled to the outputs of the first pair of amplifiers having filter circuits associated with their outputs, and a third stage differential input amplifier having means to further filter signal noise and to convert the signal to digital form with residual noise appearing as spikes in the signal.

2. Circuit means as in claim 1 wherein the first and second stage amplifiers are biased from a common source and the positive inputs of the second stage amplifiers are biased at the voltage of the mid-terminal of the bifilar windings.

3. Circuit means as in claim 1 wherein the amplifiers of the first stage and second stage are referenced against each other rather than to the voltage source or ground.

4. Circuitry as in claim 1 wherein the third stage amplifier is biased at the same voltage as first and second stage amplifiers.

5. Circuit means as in claim 1 including a digital noise filter circuit coupled to the output of said third stage.

6. Circuit means as in claim 5 wherein said digital noise filter circuit means includes means for processing the signal waveform to filter the noise spikes from.

7. Circuit means as in claim 6 wherein said digital noise filter circuit means includes means for producing a waveform of spikes, multivibrator means for producing pulses spaced midway between spikes and flip-flop means triggered by said multivibrator means whereby noise spikes are filtered out.

8. A noise suppression circuit means for suppressing signal noise in a circuit, in combination, differential amplifier means for filtering signal noise components and means for converting a filtered signal to digital form having residual noise appearing in the signal in the form of spikes, digital noise filter circuit means including means for transforming the signal waveform to spike form, multivibrator means for converting to a waveform having positive going pulses midway between incoming spikes and flip-flop means triggered by said multivibrator means whereby noise spikes are filtered.

* * * * *